United States Patent
Yamamoto et al.

(10) Patent No.: US 6,724,636 B2
(45) Date of Patent: Apr. 20, 2004

(54) ELECTRONIC DEVICE AND SYSTEM COMPOSED OF A PLURALITY OF ELECTRONIC DEVICES

(75) Inventors: Michiyuki Yamamoto, Kawasaki (JP); Masaki Yoshimaru, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 8 days.

(21) Appl. No.: 10/262,076

(22) Filed: Oct. 2, 2002

(65) Prior Publication Data
US 2003/0161130 A1 Aug. 28, 2003

(30) Foreign Application Priority Data
Feb. 28, 2002  (JP) ......................... 2002-054241

(51) Int. Cl.⁷ ............................. H05K 7/00; H05K 1/14
(52) U.S. Cl. .................. 361/747; 361/728; 361/733; 361/740; 361/741; 361/752; 361/756; 361/759; 361/788; 361/796; 361/802; 312/111; 439/248; 211/26
(58) Field of Search ................. 361/683, 686, 361/724–736, 740–744, 747–748, 752, 754, 756, 759, 784–785, 788, 798, 796–797, 801–802, 803; 312/351.1, 198, 199, 200, 107, 111, 265.1, 223.1; 211/26, 189, 26.1, 26.2; 248/544, 682, 509, 27.1; 439/247, 248, 378, 701

(56) References Cited

U.S. PATENT DOCUMENTS 2,871,457 A * 1/1959 Jencks et al. ............... 361/725
4,690,286 A * 9/1987 Horne et al. ................ 211/41
5,571,256 A * 11/1996 Good et al. ................. 211/26

FOREIGN PATENT DOCUMENTS

JP          8-300966         11/1996

* cited by examiner

Primary Examiner—Phuong T. Vu
(74) Attorney, Agent, or Firm—Armstrong, Kratz, Quintos, Hanson & Brooks, LLP

(57) ABSTRACT

Disclosed herein is an electronic device including a cabinet and a shelf accommodated in the cabinet. The shelf has a floating mechanism and a plurality of guide rails for guiding a plurality of printed circuit board units. The floating mechanism includes a plurality of holes formed through the shelf, each of the holes having a first diameter; a plurality of tapped holes formed through the cabinet so as to respectively correspond to the holes of the shelf; and a plurality of screws inserted through the holes of the shelf and threadedly engaged with the tapped holes of the cabinet, respectively, each of the screws having a second diameter smaller than the first diameter. The cabinet has a plurality of first guide pins, and the shelf has a plurality of second guide pins each having a diameter smaller than that of each first guide pin.

11 Claims, 13 Drawing Sheets

ELECTRONIC DEVICE AND SYSTEM COMPOSED OF A PLURALITY OF ELECTRONIC DEVICES

BACKGROUND OF THE INVENTION

1. Field of the Invention

The present invention relates generally to an electronic device, and more particularly to a mechanism for connecting a plurality of electronic devices with a high accuracy.

2. Description of the Related Art

In an information processing device such as a computer, many CPUs are mounted and packaged with a high density to improve the processing performance of the information processing device. However, there is a limit to the size and weight of one computer. Accordingly, the connection of a plurality of computers is essential to realize the high-speed processing performance. Conventionally, a single-sided backplane (back wiring board) is mounted in a cabinet of each computer, and a plurality of CPU boards are mounted on this backplane. Many cables are used to electrically connect the computers for the purpose of transmission of signals therebetween. Since many cables are used to electrically connect the computers as mentioned above, a connecting frame for storing the cables are used to mechanically connect the computers.

In such a conventional information processing unit employing a plurality of computers connected together, many cables must be connected to the computers one by one in a computer room at a destination, causing the requirement of much time for installation of the information processing unit. In such a conventional information processing unit configured by using a plurality of computers, an expensive backplane is mounted in the cabinet of each computer, and many cables (100 or more cables at the maximum) are used to electrically connect the computers, so that much time is required for installation of the information processing unit, causing an increase in cost.

Furthermore, since the cables must be connected one by one to the computers at the destination, there is a possibility of misconnection of the cables, causing easy occurrence of cable fault including connector fault. A connector is fixedly mounted on each printed circuit board unit (CPU board) by soldering or press-fit, and a connector adapted to engage the connector of each printed circuit board unit is fixedly mounted on the backplane by soldering or press-fit. Accordingly, in engaging the connector of each printed circuit board unit with the corresponding connector of the backplane, there is a limit to the tolerance of engagement, and it is therefore difficult to position the mating connectors in the case that each printed circuit board unit and the backplane are mounted in different cabinets.

SUMMARY OF THE INVENTION

It is therefore an object of the present invention to provide a connecting mechanism which can connect a plurality of electronic devices with a high accuracy.

It is another object of the present invention to provide an electronic device suitable for connection with a high accuracy.

In accordance with an aspect of the present invention, there is provided an electronic device comprising a cabinet and a shelf accommodated in the cabinet, the shelf having a floating mechanism and a plurality of guide rails for guiding a plurality of printed circuit board units.

Preferably, the floating mechanism comprises a plurality of holes formed through the shelf, each of the holes having a first diameter; a plurality of tapped holes formed through the cabinet so as to respectively correspond to the holes of the shelf; and a plurality of screws inserted through the holes of the shelf and threadedly engaged with the tapped holes of the cabinet, respectively, each of the screws having a second diameter smaller than the first diameter. Preferably, the cabinet has a plurality of first guide pins each having a first diameter, and the shelf has a plurality of second guide pins each having a second diameter smaller than the first diameter of each first guide pin.

Preferably, the electronic device further comprises a plurality of printed circuit board units inserted in the shelf along the guide rails. Each of the printed circuit board units has a guide hole having a third diameter smaller than the second diameter of each second guide pin. Alternatively, each of the printed circuit board units may have a third guide pin having a third diameter smaller than the second diameter of each second guide pin.

In accordance with another aspect of the present invention, there is provided a system composing of a plurality of electronic devices. The system comprises a first electronic device and a second electronic device mechanically and electrically connectable to the first electronic device. The first electronic device comprises a first cabinet; a first shelf accommodated in the first cabinet, the first shelf having a floating mechanism and a plurality of first guide rails; a plurality of first printed circuit board units inserted in the first shelf along the first guide rails, each of the first printed circuit board units having a first connector; a plurality of first guide pins fixed to the first cabinet, each of the first guide pins having a first diameter; and a plurality of second guide pins fixed to the first shelf, each of the second guide pins having a second diameter smaller than the first diameter. The second electronic device comprises a second cabinet; a second shelf fixedly accommodated in the second cabinet, the second shelf having a plurality of second guide rails; a backplane mounted on the second shelf, the backplane having a plurality of second connectors respectively engageable with the first connectors of the first printed circuit board units; a plurality of second printed circuit board units inserted in the second shelf along the second guide rails and electrically connected to the backplane; a plurality of first guide holes formed in the second cabinet for respectively engaging the first guide pins; and a plurality of second guide holes formed in the second shelf for respectively engaging the second guide pins.

Preferably, the floating mechanism of the first shelf comprises a plurality of holes formed through the first shelf, each of the holes having a third diameter; a plurality of tapped holes formed through the first cabinet so as to respectively correspond to the holes of the first shelf; and a plurality of screws inserted through the holes of the first shelf and threadedly engaged with the tapped holes of the first cabinet, respectively, each of the screws having a fourth diameter smaller than the third diameter.

In accordance with a further aspect of the present invention, there is provided a system composing of a plurality of electronic devices. The system comprises a first electronic device and a second electronic device mechanically and electrically connectable to the first electronic device. The first electronic device comprises a first cabinet; a first shelf accommodated in the first cabinet, the first shelf having a floating mechanism and a plurality of first guide rails; a plurality of first printed circuit board units inserted in the first shelf along the first guide rails, each of the first printed circuit board units having a first connector; a plurality of first guide pins fixed to the first cabinet, each of the first guide pins having a first diameter; and a plurality of second guide pins fixed to the first shelf, each of the second guide pins having a second diameter smaller than the first diameter. The second electronic device comprises a second cabinet; a second shelf fixedly accommodated in the second cabinet, the second shelf having a plurality of second guide rails; a backplane fixed to the second cabinet, the backplane having a plurality of second connectors respectively engageable with the first connectors of the first printed circuit board units; a plurality of second printed circuit board units inserted in the second shelf along the second guide rails and electrically connected to the backplane; a plurality of first guide holes formed in the second cabinet for respectively engaging the first guide pins; and a plurality of second guide holes formed in the second cabinet for respectively engaging the second guide pins.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
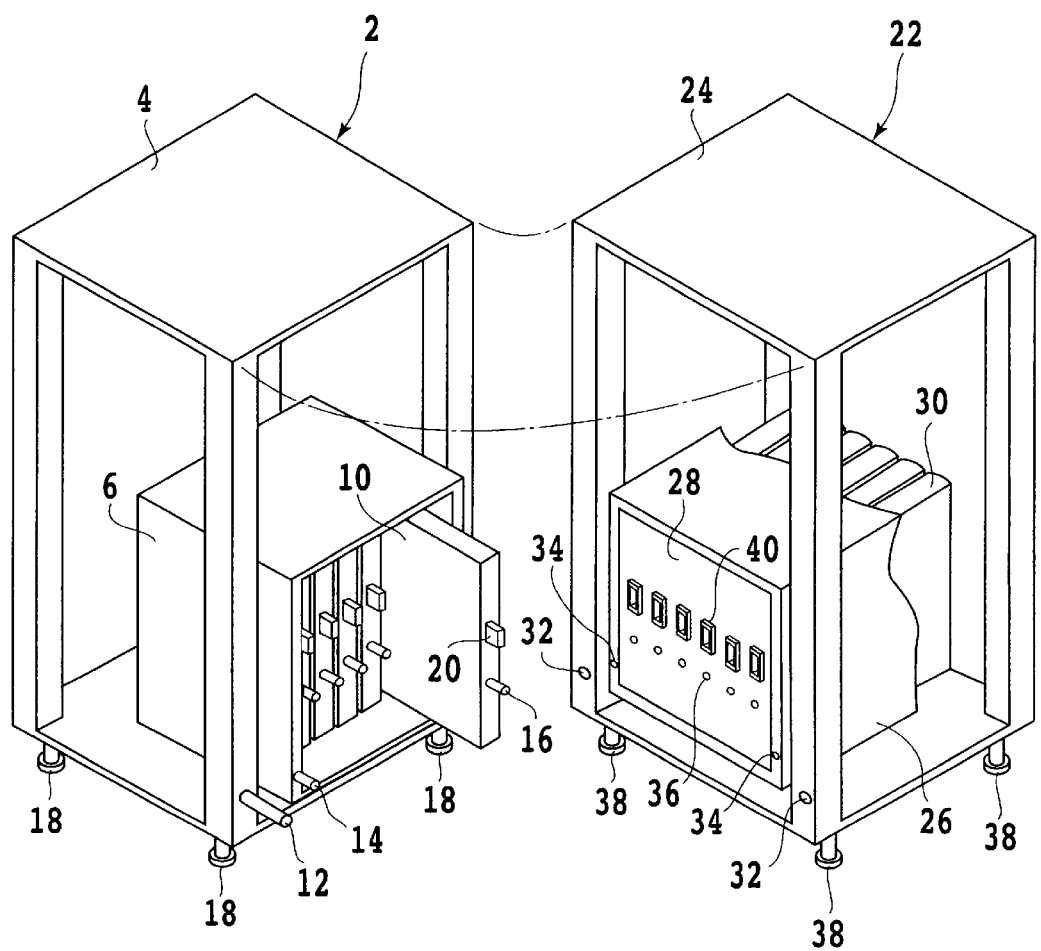
FIG. 1 is a perspective view of a first preferred embodiment of the present invention.
Figure 2:
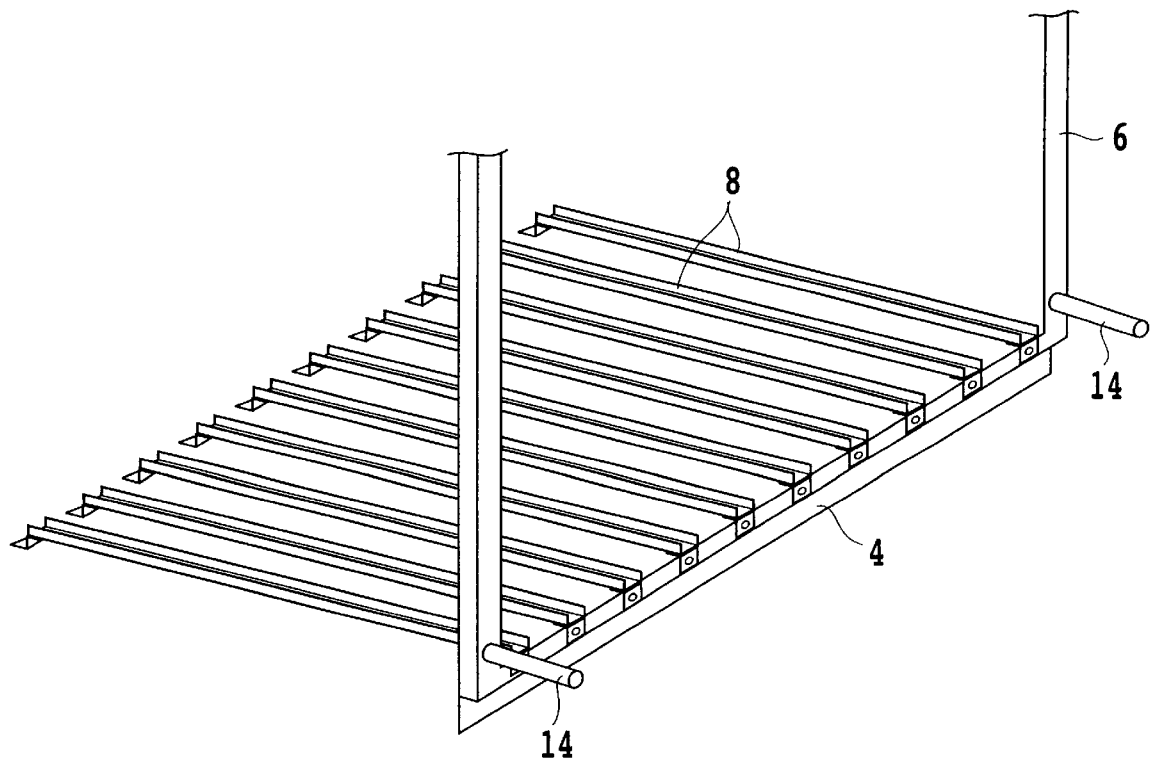
FIG. 2 is a partially cutaway, perspective view of a shelf.

Referring to FIG. 1, there is shown a perspective view of a first preferred embodiment of the present invention. Reference numeral 2 generally denotes a first computer (first electronic device). The first computer 2 has a first cabinet 4 and a first shelf 6. The first shelf 6 is accommodated in the first cabinet 4. The first shelf 6 is movably mounted on the first cabinet 4 through a floating mechanism (not shown). As shown in FIG. 2, the first shelf 6 is formed with a plurality of guide rails 8 by cutting and bending of a sheet metal. A plurality of printed circuit board units (CPU boards) 10 are inserted in the first shelf 6 along the guide rails 8. Electronic components such as a CPU are mounted on each printed circuit board unit 10.

A pair of first guide pins 12 each having a first diameter are fixed to the first cabinet 4, and a pair of second guide pins 14 each having a second diameter smaller than the first diameter are fixed to the first shelf 6. A third guide pin 16 having a third diameter smaller than the second diameter and a first connector 20 are mounted on the front end surface of each printed circuit board unit 10. Four height adjusting mechanisms (leveling mechanisms) 18 are mounted on the bottom surface of the first cabinet 4 near its four corners.

Reference numeral 22 generally denotes a second computer (second electronic device). The second computer 2 has a second cabinet 24 and a second shelf 26. The second shelf 26 is fixedly accommodated in the second cabinet 24. A backplane (back wiring board) 28 is mounted on the second shelf 26. A plurality of printed circuit board units (CPU boards) 30 are inserted in the second shelf 26 along guide rails (not shown). Each printed circuit board unit 30 is electrically connected to the backplane 28.

The second cabinet 24 is formed with a pair of first guide holes 32 into which the first guide pins 12 of the first cabinet 4 are adapted to engage. The second shelf 26 is formed with a pair of second guide holes 34 into which the second guide pins 14 of the first shelf 6 are adapted to engage. The backplane 28 is formed with a plurality of third guide holes 36 into which the third guide pins 16 of the printed circuit board units 10 are adapted to engage. A plurality of second connectors 40 into which the first connectors 20 of the printed circuit board units 10 are adapted to engage are mounted on the backplane 28. Four height adjusting mechanisms (leveling mechanisms) 38 are mounted on the bottom surface of the second cabinet 24 near its four corners.

Figure 3:
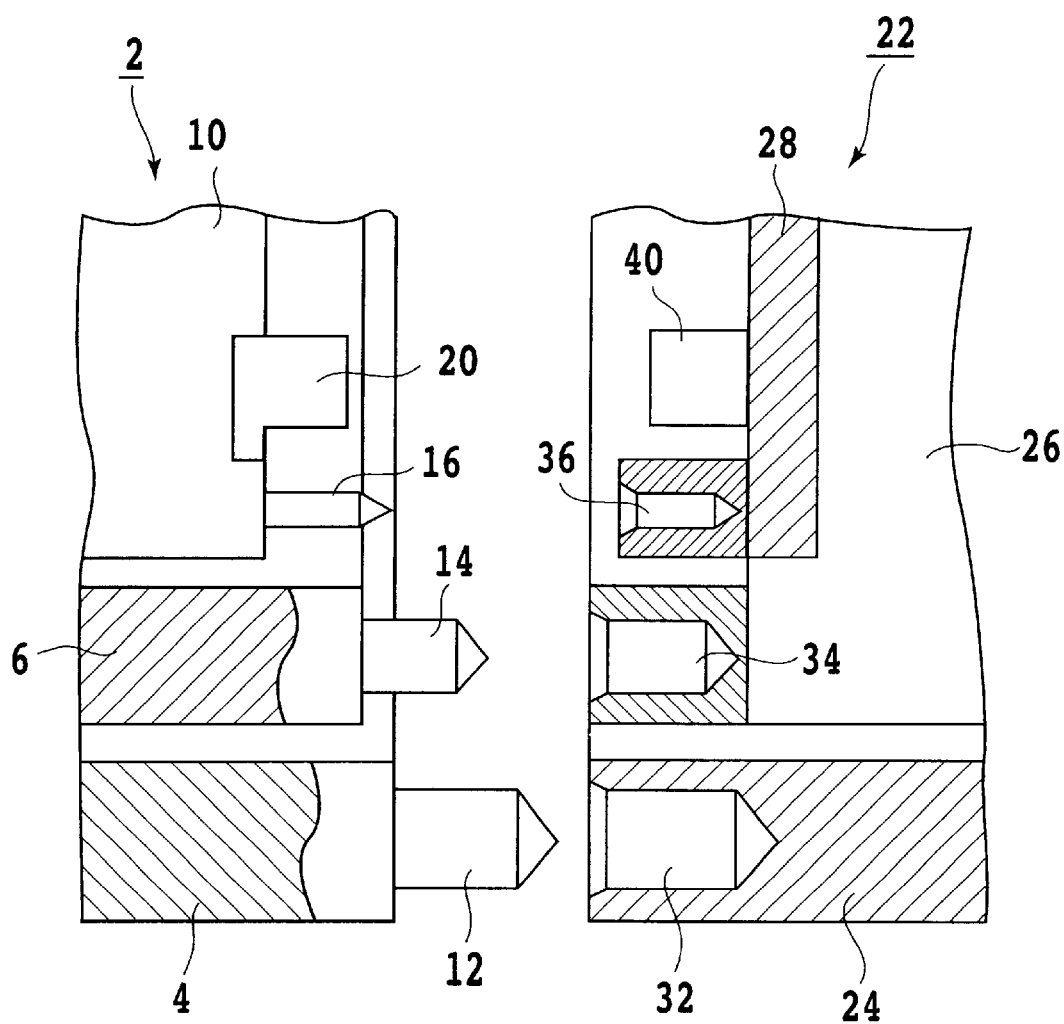
FIG. 3 is a schematic sectional view showing a connecting mechanism in detail.

Referring to FIG. 3, there is shown a schematic sectional view of a connecting mechanism for the first and second computers 2 and 22. The connecting mechanism includes the first guide pins 12, the second guide pins 14, the third guide pins 16, and the first connectors 20 in the first computer 2 and the first guide holes 32, the second guide holes 34, the third guide holes 36, and the second connectors 40 in the second computer 22.

The connecting mechanism operates in the following manner. First, the height adjusting mechanisms 18 of the first cabinet 4 and the height adjusting mechanisms 38 of the second cabinet 24 are operated to adjust the heights of the first cabinet 4 and the second cabinet 24 so that the first guide pins 12 are aligned to the first guide holes 32. Thereafter, the first computer 2 is moved toward the second computer 22 by using casters (not shown) provided on the first computer 2 to insert the first guide pins 12 into the first guide holes 32, thereby substantially positioning the first computer 2 and the second computer 22.

When the first guide pins 12 come to the intermediate positions inside the first guide holes 32, the second guide pins 14 start to be inserted into the second guide holes 34. At this time, the floating mechanism of the first shelf 6 operates to align the first shelf 6 and the second shelf 26. Thereafter, the first computer 2 is further moved toward the second computer 22 to fully insert the second guide pins 14 into the second guide holes 34, thereby positioning the first shelf 6 and the second shelf 26.

In this condition, each printed circuit board unit 10 is inserted into the first shelf 6 until the third guide pin 16 comes into engagement with the corresponding third guide hole 36 of the backplane 28. As a result, the first connector 20 comes into alignment with the corresponding second connector 40 of the backplane 28 within tolerance, thereby allowing easy engagement of these connectors 20 and 40. Thus, the first computer 2 and the second computer 22 are electrically connected through the connectors 20 and 40.

Figure 4:
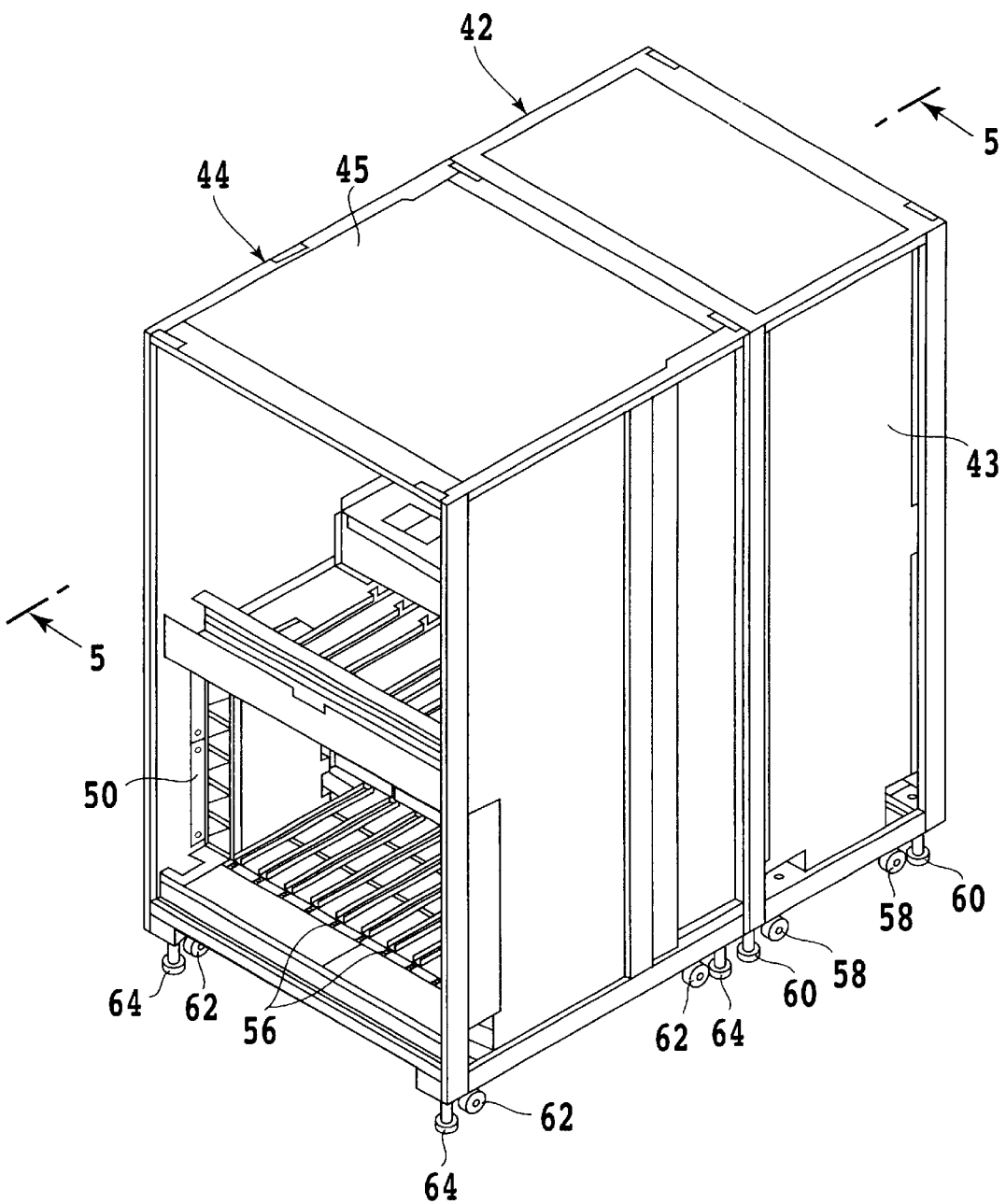
FIG. 4 is a perspective view of a second preferred embodiment of the present invention.
Figure 5:
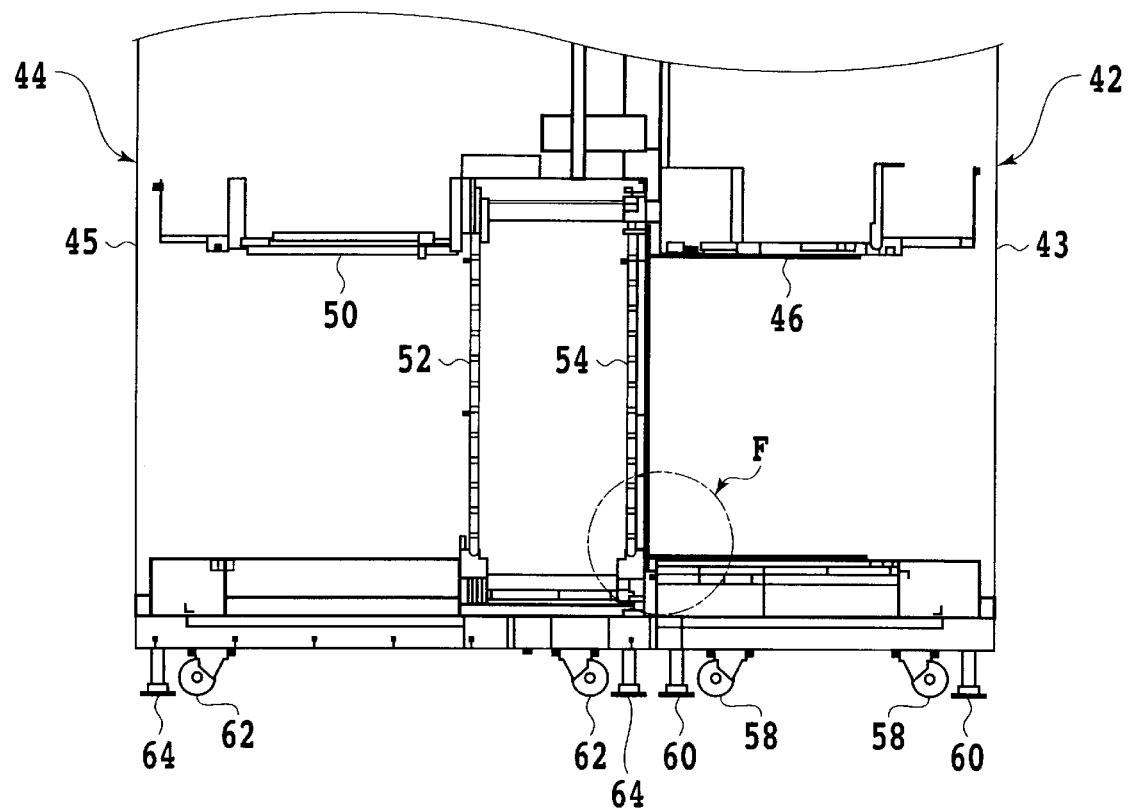
FIG. 5 is a cross section taken along the line 5—5 in FIG. 4.

Referring to FIG. 4, there is shown a perspective view of a second preferred embodiment of the present invention. FIG. 4 shows a condition where a first computer (first electronic device) 42 and a second computer (second electronic device) 44 are connected together. The second computer 44 is a computer to be fixed, and the first computer 42 is a computer to be moved. As shown in FIG. 5, a first shelf 46 having a plurality of guide rails 48 (see FIG. 6) is movably mounted in a first cabinet 43 of the first computer 42 through a plurality of floating mechanisms to be hereinafter described.

As shown in FIG. 4, a second shelf 50 having a plurality of guide rails 56 is fixedly mounted in a second cabinet 45 of the second computer 44. As shown in FIG. 5, a first backplane (first back wiring board) 52 and a second backplane (second back wiring board) 54 are further mounted on the second cabinet 45. The first backplane 52 and the second backplane 54 are electrically connected together by a printed circuit board (not shown). Four casters 58 and four height adjusting mechanisms (leveling mechanisms) 60 are mounted on the bottom surface of the first cabinet 43. Similarly, four casters 62 and four height adjusting mechanisms (leveling mechanisms) 64 are mounted on the bottom surface of the second cabinet 45.

Figure 6:
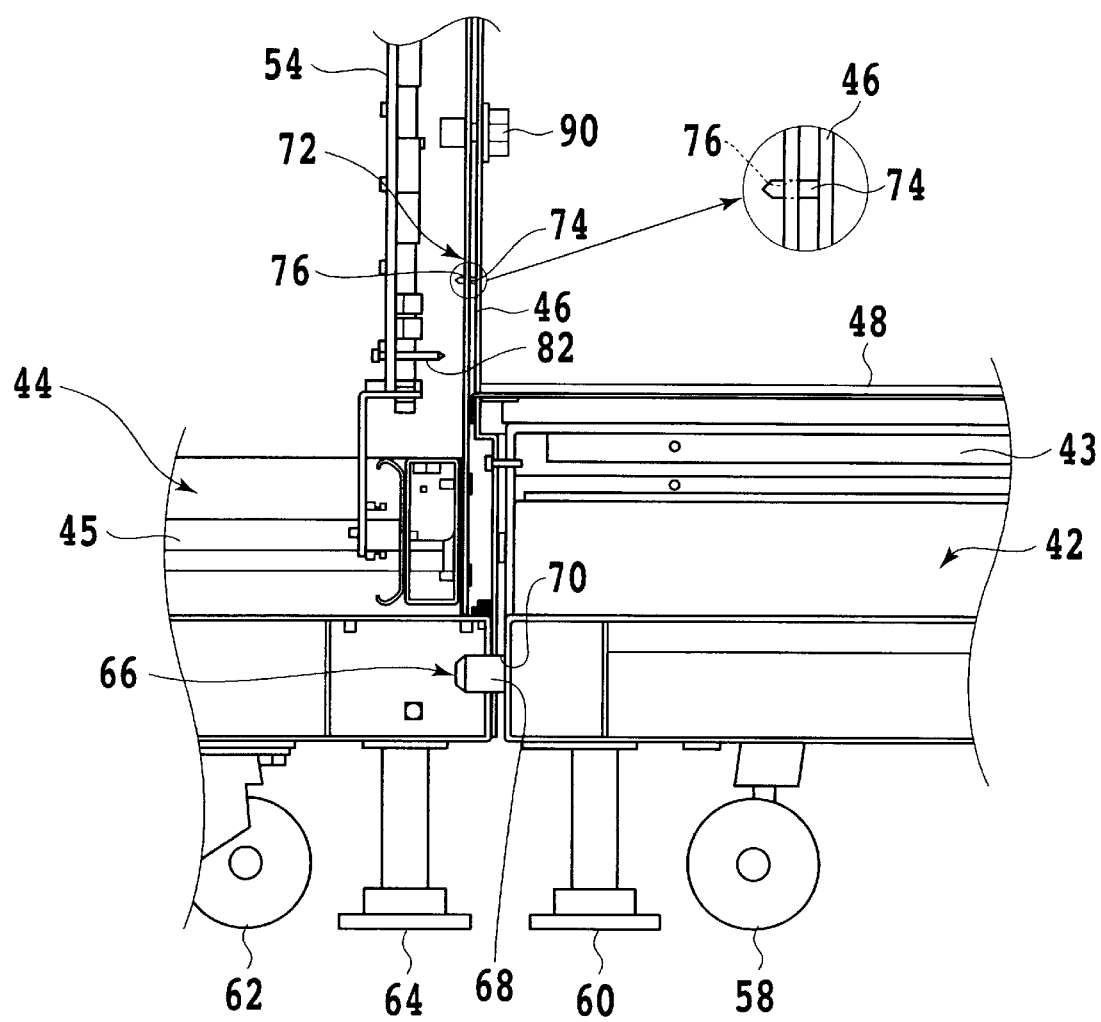
FIG. 6 is an enlarged view of an encircled portion F shown in FIG. 5.

As best shown in FIG. 6, the first cabinet 43 and the second cabinet 45 are connected together through a pair of first guide mechanisms 66 and a pair of second guide mechanisms 72. Each first guide mechanism 66 is composed of a first guide pin 68 fixed to the first cabinet 43 and a first guide hole 70 formed through the second cabinet 45. The first guide pin 68 has a first diameter, and it adapted to engage the first guide hole 70. Each second guide mechanism 72 is composed of a second guide pin 74 fixed to the first shelf 46 and a second guide hole 76 formed through the second cabinet 45. The second guide pin 74 has a second diameter smaller than the first diameter, and it is adapted to engage the second guide hole 76. As apparent from FIG. 8, the pair of first guide pins 68 are fixed to the first cabinet 43, and the pair of second guide pins 74 are fixed to the first shelf 46. Accordingly, the second cabinet 45 has the pair of first guide holes 70 respectively corresponding to the first guide pins 68, and has the pair of second guide holes 76 respectively corresponding to the second guide pins 74.

Figure 7:
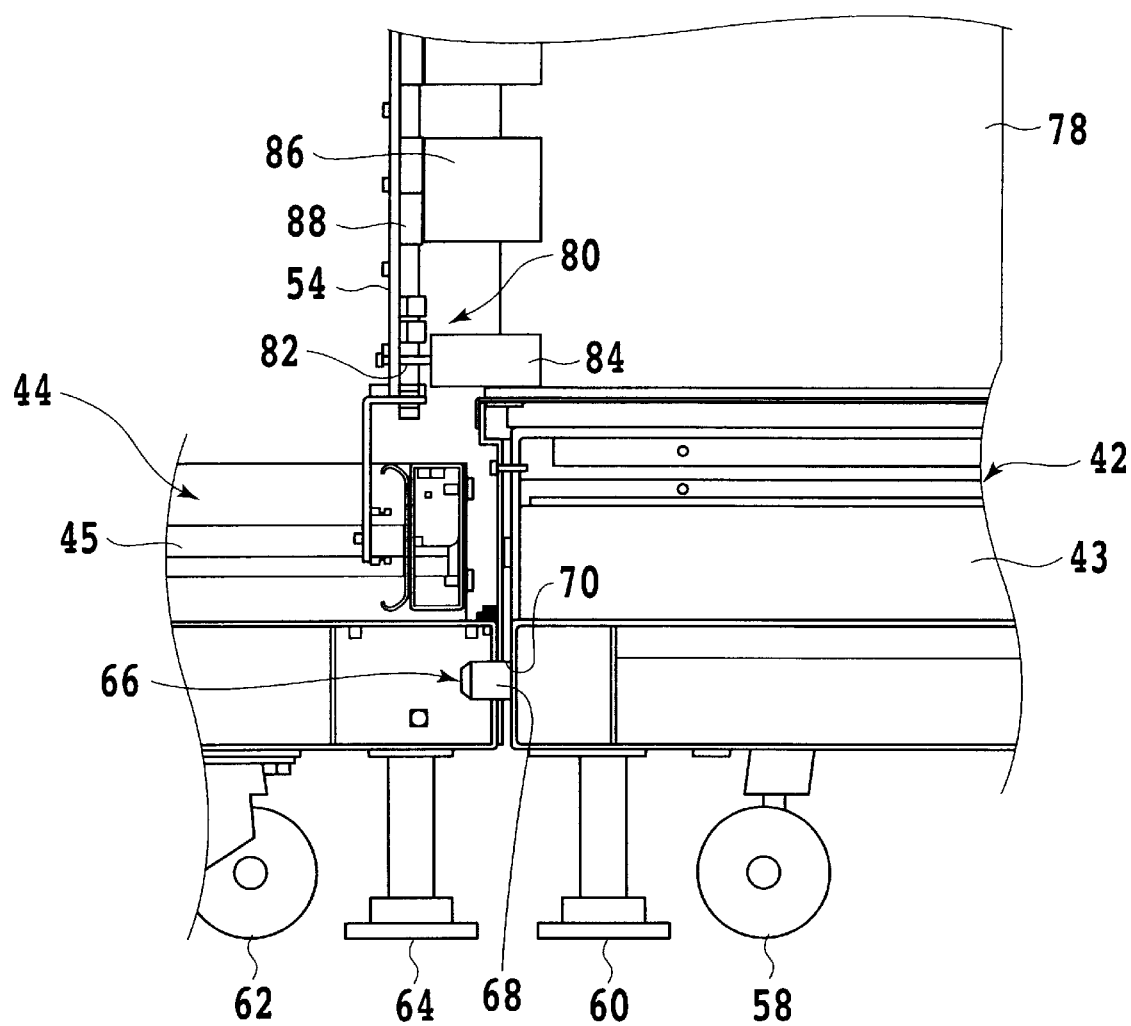
FIG. 7 is a view similar to FIG. 6, showing a condition where a printed circuit board unit is mounted.

As shown in FIG. 7, a plurality of printed circuit board units (CPU boards) 78 are inserted in the first shelf 46 along the guide rails 48. Reference numeral 80 denotes a third guide mechanism adapted to operate when each printed circuit board unit 78 is fully inserted into the first shelf 46. The third guide mechanism 80 is composed of a third guide pin 82 fixed to the second backplane 54 and a receptacle member 84 having a third guide hole and mounted on each printed circuit board unit 78.

Further, a first connector 86 is mounted on each printed circuit board unit 78, and a second connector 88 adapted to engage the first connector 86 is mounted on the second backplane 54. When each printed circuit board unit 78 is fully inserted into the first shelf 46, the third guide hole of the receptacle member 84 of the printed circuit board unit 78 comes into engagement with the corresponding third guide pin 82 of the second backplane 54. At this time, the first connector 86 of the printed circuit board unit 78 comes into alignment with the second connector 88 of the second backplane 54 within tolerance, and these connectors 86 and 88 are easily engaged together. Thus, the first computer 42 and the second computer 44 are electrically connected together through the first and second connectors 86 and 88. In this condition, a plurality of screws 90 are threadedly engaged with tapped holes formed through the surface of the second cabinet 45, thereby mechanically connecting the first cabinet 43 to the second cabinet 45.

Figure 8:
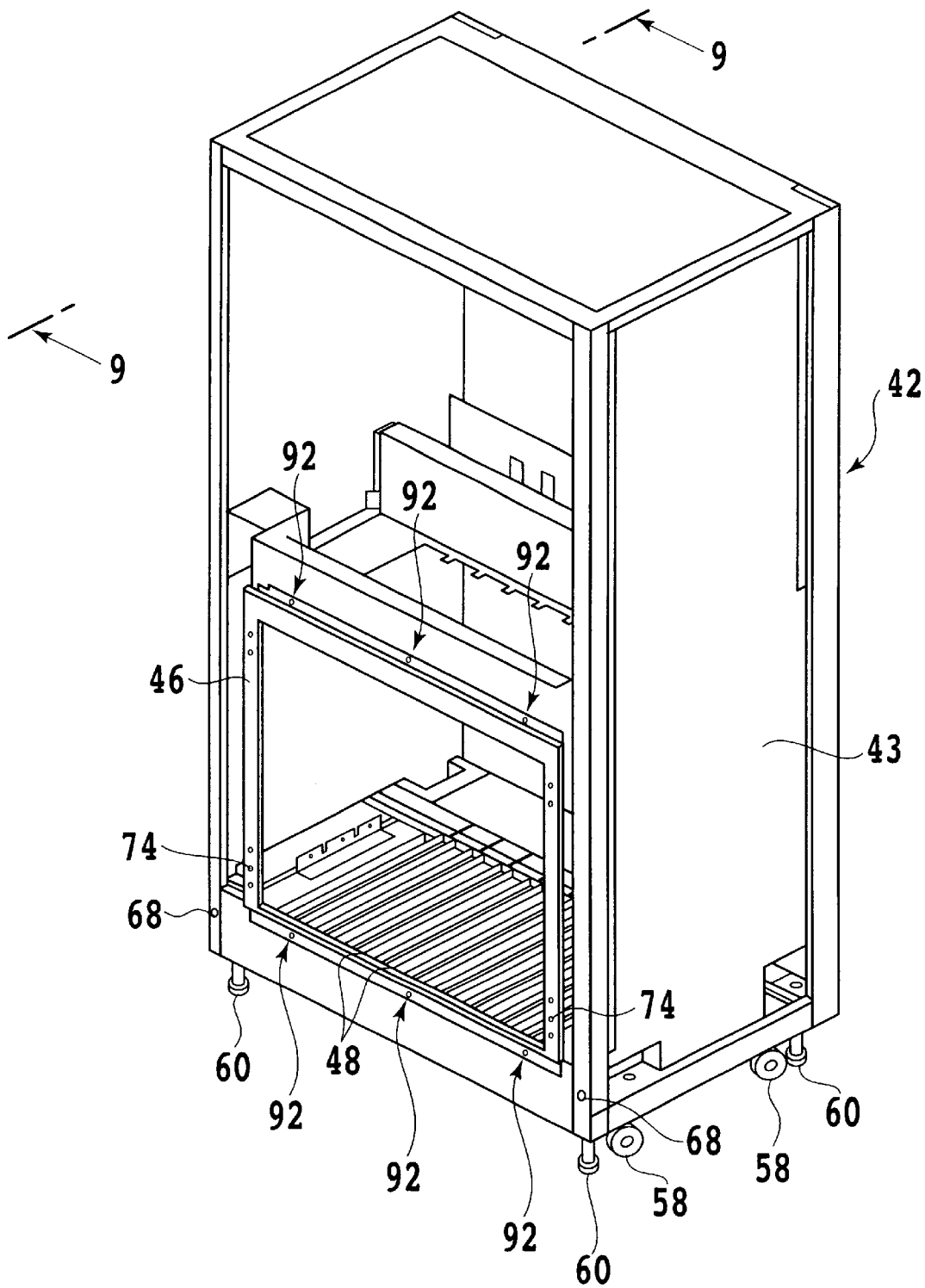
FIG. 8 is a perspective view of a first computer.
Figure 9:
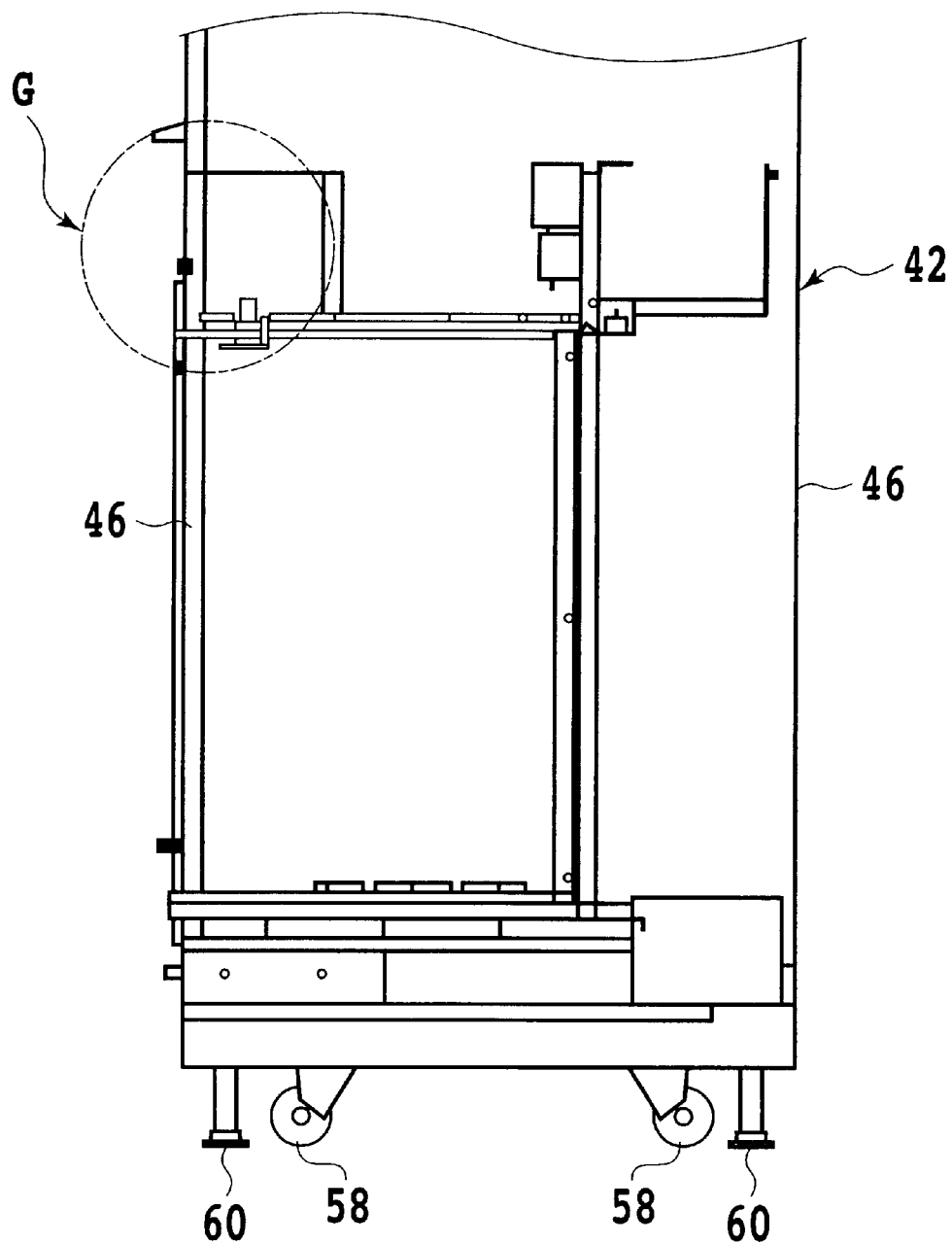
FIG. 9 is a cross section taken along the line 9—9 in FIG. 8.
Figure 10:
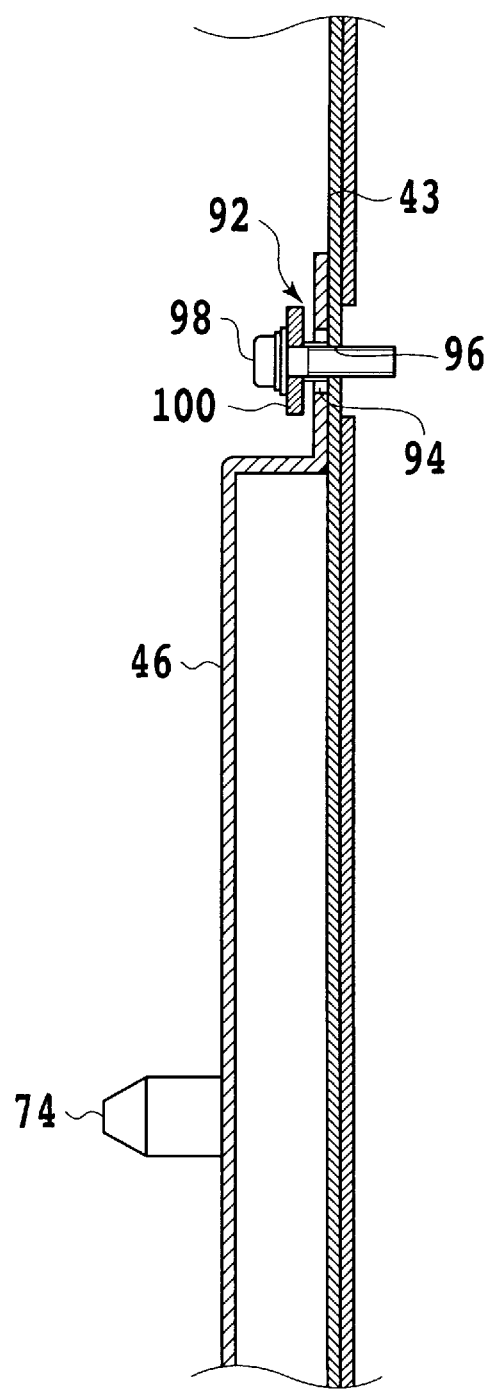
FIG. 10 is an enlarged view of an encircled portion G shown in FIG. 9.

Referring to FIGS. 8 to 10, the first shelf 46 has a plurality of floating mechanisms (movable mechanisms) 92. In this preferred embodiment, six floating mechanisms 92 are provided as shown in FIG. 8. As shown in FIG. 10, each floating mechanism 92 is composed of a round hole 94 formed through the surface of the first shelf 46, a tapped hole 96 formed through the surface of the first cabinet 43, and a screw 98 having a diameter slightly smaller than that of the round hole 94. The screw 98 is inserted through the round hole 94 with a washer 100 interposed between the screw 98 and the first shelf 46, and is screwed into the tapped hole 96 of the first cabinet 43. Since the round hole 94 of the first shelf 46 is slightly larger in diameter than the screw 98, the first shelf 46 is mounted to the first cabinet 43 so as to be slightly movable in any direction along the diameter of the round hole 94.

Figure 11A:
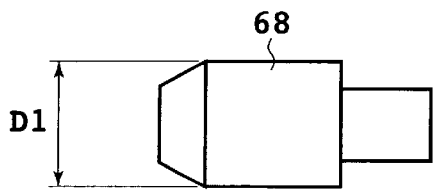
FIG. 11A is a side view of a first guide pin.
Figure 11B:
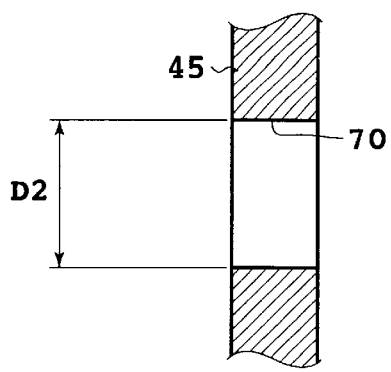
FIG. 11B is a sectional view of a first guide hole.
Figure 11C:
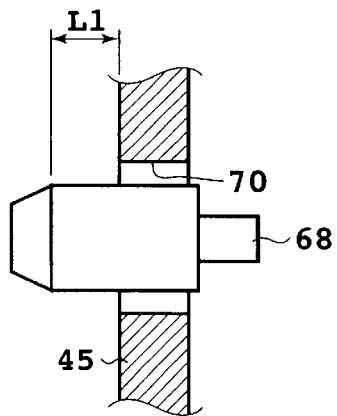
FIG. 11C is a sectional view showing the first guide pin is fully inserted into the first guide hole.
Figure 12A:
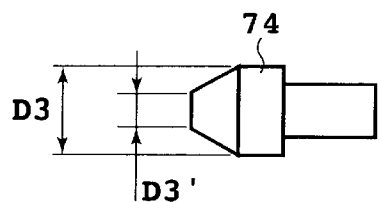
FIG. 12A is a side view of a second guide pin.
Figure 12B:
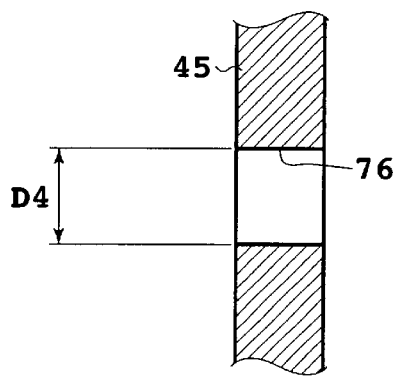
FIG. 12B is a sectional view of a second guide hole.
Figure 12C:
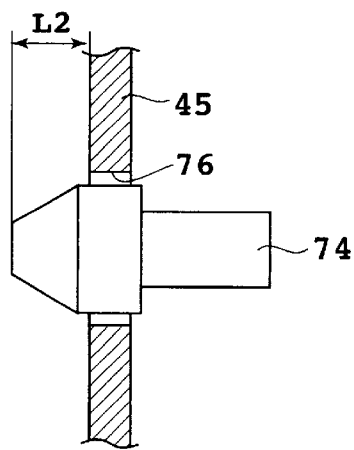
FIG. 12C is a sectional view showing the second guide pin is fully inserted into the second guide hole.
Figure 13A:
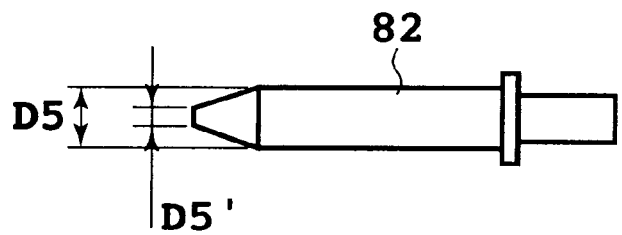
FIG. 13A is a side view of a third guide pin.
Figure 13B:
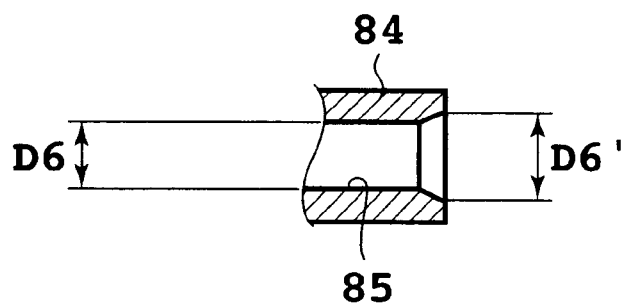
FIG. 13B is a sectional view of a third guide hole.

Referring to FIGS. 11A to 13B, there are shown the dimensions of the first, second, and third guide mechanisms in this preferred embodiment. As shown in FIGS. 11A and 11B, the first guide pin 68 has a diameter D1, and the first guide hole 70 formed through the second cabinet 45 has a diameter D2. For example, the diameter D1 is 14 mm, and the diameter D2 is 16 mm. As shown in FIGS. 12A and 12B, the second guide pin 74 has a diameter D3, the head end of the second guide pin 74 has a diameter D3' and the second guide hole 76 formed through the second cabinet 45 has a diameter D4. For example, the diameter D3 is 9.8 mm, and the diameter D4 is 10.1 mm. As shown in FIGS. 13A and 13B, the third guide pin 82 has a diameter D5, the head end of the third guide pin 82 has a diameter D5' and the third guide hole 85 formed through the receptacle member 84 has diameters D6 and D6'. For example, the diameter D5 is 4.85 mm, and the diameter D6 is 5.4 mm.

There will now be described a method of connecting the first computer 42 to the second computer 44. First, the height adjusting mechanisms 60 mounted on the bottom surface of the first cabinet 43 and the height adjusting mechanisms 64 mounted on the bottom surface of the second cabinet 45 are operated to make the heights of the first and second cabinets 43 and 45 substantially equal to each other. Thereafter, the first computer 42 is moved toward the second computer 44 by using the casters 58 to substantially position the first cabinet 43 and the second cabinet 45 by means of the first guide mechanisms 66.

When the first guide pins 68 are inserted into the first guide holes 70 until their intermediate positions, the second guide mechanisms 72 start to operate. That is, the second guide pins 74 start to be inserted into the second guide holes 76. As a result, the first shelf 46 mounted on the first cabinet 43 in the floating condition is slightly moved to align the second guide pins 74 and the second guide holes 76. Thereafter, the first computer 42 is further moved toward the second computer 44 to fully insert the first guide pins 68 into the first guide holes 70 and fully insert the second guide pins 74 into the second guide holes 76. In this condition, each printed circuit board unit (CPU board) 78 is fully inserted into the first shelf 46 as shown in FIG. 7 until the third guide pin 82 comes into engagement with the corresponding third guide hole 85 of the receptacle member 84. As a result, the first connector 86 comes into alignment with the corresponding second connector 88 of the backplane 54 within tolerance, thereby allowing easy engagement of these connectors 86 and 88.

Further explanations will be given below regarding the engagement of the first and the second connectors 86 and 88 using dimensional relationship among the diameters of the first to third guide pins 68, 74 and 82 and the diameters of the first to third guide holes 70, 76 and 85. We now put G1=D2−D1, G2=D4−D3, G2'=D4−D3', G3=D6−D5 and G3'=D6'−D5'. The connectors 86 and 88 have a self-guide mechanism allowing the dimension G4 to be self-guided. As show in FIG. 11C, the distance between the front end of the diameter D1 portion of the first guide pin 68 and the surface of the second cabinet 45 is given L1. Similarly, as shown in FIG. 12C, the distance between the front end of the second guide pin 74 and the surface of the second cabinet 45 is given L2.

Since it is designed to satisfy G1<G2' and L2≦L1, when the first guide pin 68 is inserted into the first guide hole 70, the second guide pin 74 is automatically brought into alignment with the second guide hole 76. Accordingly, when the first guide pin 68 is further inserted deep into the first guide hole 70, the second guide pin 74 is automatically inserted into the second guide hole 76.

Besides, it is designed to satisfy G2<G3'. Therefore, when the second guide pin 74 is inserted into the second guide hole 76, the third guide pin 82 is brought into alignment with the third guide hole 85. Accordingly, when the second guide pin 74 is further inserted deep into the second guide hole 76, the third guide pin 82 is automatically inserted into the third guide hole 85.

Further, since it is designed to satisfy G3<G4, when the third guide pin 82 is inserted into the third guide hole 85, the first connector 86 comes into alignment with the corresponding second connector 88 of the backplane 54 within tolerance or self-guidable dimension G4, therby allowing easy engagement of these connectors 86 and 88.

According to the present invention as described above, a plurality of electronic devices can be mechanically and electrically connected together with a high accuracy. Since the electrical connection of the electronic devices is made by connectors rather than by cables, the misconnection of cables can be prevented to thereby improve the reliability. Further, since it is unnecessary to connect many cables at the destination, the electronic devices can be installed in a short time, thereby allowing a substantial reduction in cost.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An electronic device comprising:
a cabinet having a plurality of first guide pins each having a first diameter; and a shelf accommodated in said cabinet, said shelf having a floating mechanism, a plurality of guide rails for guiding a plurality of printed circuit board units, and a plurality of second guide pins each having a second diameter smaller than said first diameter of each first guide pin; and
a plurality of printed circuit board units inserted in said shelf along said guide rails;
each of said printed circuit board units having a connector and a guide hole having a third diameter smaller than said second diameter, said guide hole being independent of said connector.

2. An electronic device according to claim 1, wherein said floating mechanism comprises:
a plurality of holes formed through said shelf, each of said holes having a fourth diameter;
a plurality of tapped holes formed through said cabinet so as to respectively correspond to said holes of said shelf; and
a plurality of screws inserted through said holes of said shelf and threadedly engaged with said tapped holes of said cabinet, respectively, each of said screws having a fifth diameter smaller than said fourth diameter.

3. An electronic device according to claim 1, wherein said cabinet has a plurality of height adjusting mechanisms.

4. An electronic device comprising:
a cabinet having a plurality of first guide pins each having a first diameter;
a shelf accommodated in the cabinet, said shelf having a floating mechanism, a plurality of guide rails for guiding a plurality of printed circuit board units, and a plurality of second guide pins each having a second diameter smaller than said first diameter of each first guide pin; and
a plurality of printed circuit board units inserted in said shelf along said guide rails;
each of said printed circuit board units having a connector and a third guide pin having a third diameter smaller than said second diameter, said third guide pin being independent of said connector.

5. A system composing of a plurality of electronic devices comprising:
a first electronic device; and
a second electronic device mechanically and electrically connectable to said first electronic device;
said first electronic device comprising:
a first cabinet;
a first shelf accommodated in said first cabinet, said first shelf having a floating mechanism and a plurality of first guide rails;
a plurality of first printed circuit board units inserted in said first shelf along said first guide rails, each of said first printed circuit board units having a first connector;
a plurality of first guide pins fixed to said first cabinet, each of said first guide pins having a first diameter; and
a plurality of second guide pins fixed to said first shelf, each of said second guide pins having a second diameter smaller than said first diameter;
said second electronic device comprising:
a second cabinet;
a second shelf fixedly accommodated in said second cabinet, said second shelf having a plurality of second guide rails;
a backplane mounted on said second shelf, said backplane having a plurality of second connectors respectively engageable with said first connectors of said first printed circuit board units;
a plurality of second printed circuit board units inserted in said second shelf along said second guide rails and electrically connected to said backplane;

a plurality of first guide holes formed in said second cabinet for respectively engaging said first guide pins; and a plurality of second guide holes formed in said second shelf for respectively engaging said second guide pins.

6. A system according to claim 5, wherein said first electronic device further comprises a plurality of height adjusting mechanisms mounted on said first cabinet.

7. A system according to claim 5, wherein said floating mechanism of said first shelf comprises:

a plurality of holes formed through said first shelf, each of said holes having a third diameter;

a plurality of tapped holes formed through said first cabinet so as to respectively correspond to said holes of said first shelf; and a plurality of screws inserted through said holes of said first shelf and threadedly engaged with said tapped holes of said first cabinet, respectively, each of said screws having a fourth diameter smaller than said third diameter.

8. A system according to claim 5, wherein:

said first electronic device further comprises a plurality of third guide pins respectively fixed to said first printed circuit board units, each of said third guide pins having a third diameter smaller than said second diameter; and said backplane of said second electronic device further has a plurality of third guide holes for respectively engaging said third guide pins.

9. A system composing of a plurality of electronic devices comprising:

a first electronic device; and a second electronic device mechanically and electrically connectable to said first electronic device;

said first electronic device comprising:

a first cabinet;

a first shelf accommodated in said first cabinet, said first shelf having a floating mechanism and a plurality of first guide rails;

a plurality of first printed circuit board units inserted in said first shelf along said first guide rails, each of said first printed circuit board units having a first connector;

a plurality of first guide pins fixed to said first cabinet, each of said first guide pins having a first diameter; and a plurality of second guide pins fixed to said first shelf, each of said second guide pins having a second diameter smaller than said first diameter;

said second electronic device comprising:

a second cabinet;

a second shelf fixedly accommodated in said second cabinet, said second shelf having a plurality of second guide rails;

a backplane fixed to said second cabinet, said backplane having a plurality of second connectors respectively engageable with said first connectors of said first printed circuit board units;

a plurality of second printed circuit board units inserted in said second shelf along said second guide rails and electrically connected to said backplane;

a plurality of first guide holes formed in said second cabinet for respectively engaging said first guide pins; and a plurality of second guide holes formed in said second cabinet for respectively engaging said second guide pins.

10. A system according to claim 9, wherein said floating mechanism of said first shelf comprises:

a plurality of holes formed through said first shelf, each of said holes having a third diameter;

a plurality of tapped holes formed through said first cabinet so as to respectively correspond to said holes of said first shelf; and a plurality of screws inserted through said holes of said first shelf and threadedly engaged with said tapped holes of said first cabinet, respectively, each of said screws having a fourth diameter smaller than said third diameter.

11. A system according to claim 9, wherein:

said second electronic device further comprises a plurality of third guide pins fixed to said backplane, each of said third guide pins having a third diameter smaller than said second diameter; and said first electronic device further comprises a plurality of third guide hole respectively formed in said first printed circuit board units for respectively engaging said third guide pins.

* * * * *